United States Patent [19]

Tidrow et al.

[11] Patent Number: 6,117,572

[45] Date of Patent: Sep. 12, 2000

[54] YBCO EPITAXIAL FILMS DEPOSITED ON SUBSTRATE AND BUFFER LAYER COMPOUNDS IN THE SYSTEM $CA_2MESBO_6$ WHERE ME=AL, GA, SC AND IN

[75] Inventors: Steven C. Tidrow, Silver Spring, Md.; Arthur Tauber, Elberon, N.J.; William D. Wilber, Neptune, N.J.; Robert D. Finnegan, West Long Branch, N.J.

[73] Assignee: The United States of America as represented by the Secretary of the Army, Washington, D.C.

[21] Appl. No.: 08/978,364

[22] Filed: Nov. 25, 1997

[51] Int. Cl.$^7$ .............................. B32B 9/00; C01G 15/00; C01G 30/02

[52] U.S. Cl. .................... 428/697; 428/701; 428/702; 423/593; 423/617; 423/624; 423/625

[58] Field of Search ................................ 423/263, 583, 423/593, 617, 624, 625; 428/688, 689, 701, 702, 699, 930, 697; 502/525; 505/238, 239; 117/947

[56] References Cited

U.S. PATENT DOCUMENTS

| | | | |
|---|---|---|---|
| 5,814,584 | 9/1998 | Tauber et al. | 505/238 |
| 5,856,276 | 1/1999 | Koshy et al. | 505/239 |

OTHER PUBLICATIONS

Blasse, G. "New Compounds with Perovskite like Structures", Koninkl. Ne Akad. Wetenschap, Proc. Ser, B 67(3), pp. 312–313, 1964.

Wittman, G. Rauser and Kemmler–Sack, S. "Uber die Ordnung von BIII und MV in Perowskiten vom Typ A2IIBIIIMVO6" Z. Anorg Allg. Chem., No 482, pp. 143–153, 1981.

U.S. application No. 08/717.822, Tauber et al., filed Sep. 24, 1996.

U.S. application No. 08/502,739, Tauber et al., filed Jun. 30, 1995.

Sleight, A.W. et al, Inorganic Chemistry, 3rd edition, p. 292 (1964); (no month).

Fesenko, E.G. et al, "Synthesis and Study of $A_2Sb^{5+}BO_6$ and $A_3Sb^{5+}BO_6$ Type Ternary Oxides with Perovskite Structure", Izvestia Akademii, Nauk SSSR, Neorganicheskie Materialy, 6(4), 800–2 (1970), Tostov, Gos. University, Rostov, USSR; (no month).

Shannon, R.D. et al, "Dielectric Constants of Yttrium and Rare Earth Garnets, the Polarizability of Gallium Oxide, and the Oxide Addivity Rule", 67(8) Journal of Applied Physics, 3798 (1990); ( no month).

Shannon, R.D. et al, "Dielectric Polarizabilities of Ions in Oxides and Fluorides", 73(1) Journal of Applied Physics, 348 (1993); (no month).

Fratello, V.J. et al, "Calculation of Dielectric Polarizabilities of Perovskite Substrate Materials for High–Temperature Superconductors", 9(10) Journal of Materials Research, 2554 (1994); and (no month).

Tidrow, S.C. et al, "Dielectric Properties of Periovskite Antimonates", IEEE Transactions on Applied Superconductivity, 1769 (1997), (no month).

*Primary Examiner*—Timothy M. Speer
*Assistant Examiner*—Stephen Stein
*Attorney, Agent, or Firm*—Michael Zelenka; George B. Tereschuk

[57] ABSTRACT

Compounds of the general formula $Ca_2MeSbO_6$ where Me is a 3+ ion selected from the group consisting of aluminum (Al), scandium (Sc), indium (In), gallium (Ga), or a rare earth metal have been prepared and included as the substrate or barrier dielectric in high critical temperature thin film superconductors, ferroelectrics, pyroelectrics, piezoelectrics, and hybrid device structures.

13 Claims, No Drawings

YBCO EPITAXIAL FILMS DEPOSITED ON SUBSTRATE AND BUFFER LAYER COMPOUNDS IN THE SYSTEM CA$_2$MESBO$_6$ WHERE ME=AL, GA, SC AND IN

RELATED APPLICATION

CECOM Docket No. 5151 entitled "Compounds In the Series A$_2$MeSbO$_6$ For Use As Substrates, Barrier-Dielectric Layers And Passivating Layers in High Critical Temperature Superconducting Devices," U.S. patent Ser. No. 08/502,739, now U.S. Pat. No. 5,814,584, which has been partially assigned to the same assignee, has been filed in the United States Patent and Trademark Office and is related to this application.

GOVERNMENT INTEREST

The invention described herein may be manufactured, used, and licensed by or for the Government for governmental purposes without the payment to us of any royalties thereon.

FIELD OF INVENTION

The invention relates in general to dielectric substrates and buffer layers to be used in High Critical Temperature Superconducting YBa$_2$Cu$_3$O$_{7-\delta}$ (YBCO) devices, and in particular to new and useful compounds of the general formula Ca$_2$MeSbO$_6$ where Me is a 3+ ion selected from the group consisting of aluminum (Al), scandium (Sc), indium (In), gallium (Ga) or a rare earth metal.

BACKGROUND OF THE INVENTION

Most superconducting microwave devices continue to be fabricated from epitaxial thin structures deposited on single crystal substrates. The need for better lattice-matched, cubic, low dielectric constant and low microwave loss substrates and buffers continues. Heretofore, a popular substrate or barrier dielectric in thin film superconductor technology has been Lanthanum Aluminate, known as LaAlO$_3$, but it is being challenged by Lanthanum Strontium Aluminum Tantalate, known as LSAT, which is a solid solution of 30 mole % LaAlO$_3$ and 70 mole % Sr$_2$AlTaO$_6$. LSAT overcomes several of the drawbacks associated with LaAlO$_3$, because it is cubic, does not undergo phase transition and has a slightly lower dielectric constant. Also, LaAlO$_3$ places High Critical Temperature Superconductor (HTSC) films in compression, an advantage for brittle films having a poor thermal expansion match to the substrate. The LSAT lattice parameter falls between that of the a and b parameters of YBCO and introduces less stress than LaAlO$_3$, providing an even greater advantage for use in HTSC films. The dielectric constant for LaAlO$_3$ is 24, while for LSAT it is 22 and both are relatively large. Thus an optimum substrate or buffer would be one having a much lower dielectric constant such as those listed in TABLE I, which range from 9.5 to 15.0.

Prior investigations by the inventors herein and others have been made with ordered perovskites of the A$_2$MeSbO$_6$ compounds where A is barium or strontium and Me is a trivalent ion that is often ordered on octahedral sites of those compounds. These findings are included in patent applications CECOM Docket No. 5304, entitled "Rare Earth Metal Compounds For Use In High Critical Temperature Thin Film Superconductors, Ferroelectrics, Pyroelectrics, Piezoelectrics, and Hybrids," U.S. patent Ser. No. 08/717, 822 and CECOM Docket No. 5151, entitled "Compounds In the Series A$_2$MeSbO$_6$ For Use As Substrates, Barrier-Dielectric Layers And Pasivating Layers in High Critical Temperature Superconducting Devices," U.S. patent Ser. No. 08/502,739, both of which are incorporated herein by reference. Because pentavalent ions have a small polarizability, the dielectric constant for these compounds are much smaller than those observed in either LaAlO$_3$ or LSAT.

It is well-known that the polarizability of Ca 2+on A sites in perovskite is 30% smaller than Sr$^{2+}$ and 100% smaller than Ba$^{2+}$. Since Ca$^{2+}$ is smaller than Ba$^{2+}$ or Sr$^{2+}$, its size affords a better opportunity to control the lattice parameter. Due to these properties of Ca$^{2+}$, it is theorized that compounds in the system Ca$_2$MeSbO$_6$, where Me is a 3+ ion selected from the group consisting of aluminum (Al), scandium (Sc), indium (In), gallium (Ga), or a rare earth metal would provide a lattice matched, cubic perovskite with a low dielectric constant ranging between 9.5 and 15.0 (see TABLE I) that would overcome the long-felt shortcomings, drawbacks and limitations observed in both LaAlO$_3$ and LSAT. The Al, Sc, In, Cr, Mn and rare earth containing compounds were first prepared by Fesenko, et. al. and they found that the Al, Sc, Cr, Fe and Mn containing compounds were cubic and the In compound was monoclinic, with the lattice parameters given in Table I, and they also found the rare-earth compounds to be monoclinic. The crystallographic observations made by the present inventors are in some cases different than the literature. In addition, the present inventors have determined that the properties of some of these compounds in the system Ca$_2$MeSbO$_6$ satisfy the requirements for use as substrate and buffer/dielectric layers in accordance with the present invention, for growth of epitaxial YBCO films, multilayer and device structures, without suffering from any of the disadvantages, drawbacks, limitations and shortcomings of other materials like LaAlO$_3$ and LSAT.

Prior art in this area is found at A. W. Sleight and R. Ward, *Inorganic Chemistry*, 3 rd edition, p. 292 (1964);

E. G. Fesenko, et. al., "Synthesis and Study of A$_2$Sb$^{5+}$BO$_6$ and A$_3$Sb$^{5+}$BO$_6$ Type Ternary Oxides with Perovskite Structure," Izvestia Akademii, Nauk SSSR, Neorganicheskie Materialy, 6(4), 800-2 (1970), Rostov, Gos. University, Rostov, USSR;

R. D. Shannon, et. al., "Dielectric Constants of Yttrium and Rare Earth Garnets, the Polarizability of Gallium Oxide, and the Oxide Addivity Rule," 67(8) Journal of Applied Physics, 3798 (1990);

R. D. Shannon, et. al., "Dielectric Polarizabilities of Ions in Oxides and Fluorides," 73(1) Journal of Applied Physics, 348 (1993);

V. J. Fratello et. al., "Calculation of Dielectric Polarizabilities of Perovskite Substrate Materials For High-Temperature Superconductors," 9(10) Journal of Materials Research, 2554 (1994); and S. C. Tidrow et. al., "Dielectric Properties of Perovskite Antimonates," 7(2) IEEE Transactions on Applied Superconductivity, 1769 (1997).

SUMMARY OF THE INVENTION

The general object of this invention is to provide materials that can be used as a substrate or barrier dielectric in thin film superconductor technology that can overcome the shortcomings of LaAlO$_3$ and LSAT. A more particular object of the invention is to provide a substrate or barrier dielectric with a lattice matched, cubic perovskite with a low dielectric constant that overcomes the long-felt shortcomings, drawbacks and limitations observed in both LaAlO$_3$ and LSAT.

It has now been found that the aforementioned objectives can be attained using a compound of the general formula $Ca_2MeSbO_6$ as the substrate or barrier dielectric in thin film superconductor technology. In the above formula Me is a 3+ion selected from the group consisting of aluminum (Al), scandium (Sc), indium (In), gallium (Ga), or a rare earth metal. A further advantage of the compounds of the present invention is that the $Ca_2AlSbO_6$ compound exhibits a lattice parameter of 7.579 Å and, as described in TABLE I, a dielectric constant of between 9.5 and 15.0. which is substantially less than $LaAlO_3$, which is 24. Solid solutions between these two compounds will yield an adjustable lattice parameter to control tension and compression of HTSC films while yielding lower dielectric constants that are very significant for microwave devices. These compounds can be used as barrier or buffer layers and substrates in thin film high critical temperature superconducting structures.

Other features and details of the present invention will become apparent in light of the Detailed Description of the Preferred Embodiment of the Invention and the accompanying Tables I and II summarizing the bulk and film properties of $Ca_2MeSbO_6$ compounds, respectively, in accordance with the present invention. No drawings or figures are provided.

DESCRIPTION OF THE PREFERRED EMBODIMENT

The following compounds in the series $Ca_2MeSbO_6$ have been synthesized for use as dielectric substrates and barrier layers in thin film high critical temperature superconductor devices in accordance with the present invention: Calcium Aluminum Antimonate, known as $Ca_2AlSbO_6$, Calcium Gallium Antimonate, known as $Ca_2GaSbO_6$, Calcium Scandium Antimonate, known as $Ca_2ScSbO_6$, Calcium Indium Antimonate, known as $Ca_2InSbO_6$ and a solid solution of $Ca_2AlSbO_6$ and $LaAlO_3$, known as Lanthanum Calcium Aluminum Antimonate (LCAS) exhibiting the properties listed in Table I including a dielectric loss ranging between 9.5 and 15.0, loss tangents between less than $1\times10^{-3}$ and $6.0\times10^{-3}$, along with measured material densities between 4.51% $g/cm^{-3}$ to 5.16 $g/cm^{-3}$.

The bulk target compounds in the system $Ca_2MeSbO_6$ were prepared by solid state reaction. All compounds were prepared as follows:

Stoichiometric amounts of precursor constituents which were 99.9% pure or better $CaCO_3$, $Al_2O_3$, $Ga_2O_3$, $Sc_2O_3$, $In_2O_3$ and $Re_2O_3$, where R is a rare earth metal, were ground together in a BC mortar until a homogeneous powder was obtained. The powder was pressed into 2.54 cm disks and heated at 3° C./minute to 1100° C., held for 15–20 hours and then cooled to room temperature. The disks were ground to a powder of 100 $\mu$m or less, pressed into 3.18 cm disks in a steel die, repressed isostatically at 344 MPa, ramped at 18° C./hour, sintered between 1400° and 1550° C. for 20–60 hours, cooled to 100° C. at the same rate and then removed from the furnace. When x-ray diffractometry scans revealed the presence of a second phase, the disks were reground and the last step was repeated until a single phase was produced. $\theta$ to $2\theta$ x-ray scans from 15 to 155 $2\theta$ were made using $CuK\alpha$ radiation, from which lattice parameters were obtained by using a least-squares fit to the Nelson-Riley function, as set forth in Table I. He gas pycnometry was employed for density measurements which are compared with the x-ray densities shown in Table I.

Microwave measurements of the real and imaginary parts of the dielectric constant were performed at approximately 9.32 and 10.1 GHz and room temperature. A cavity perturbation technique was used with a reflection-type, rectangular cavity excited in the $TE_{106}$ mode for 9.3 GHz. The cavity was coupled to the waveguide by an adjustable iris having a 0.5 mm side by 35 mm long slot, which was cut along the center of one of the broad sides, providing access for the thin, rectangular samples. The samples were held so that their long dimension is parallel to the E-field of the cavity and they were positioned at the E-field maximum as determined by maximizing the shift of the cavity.

The bulk disks were employed as targets for pulsed laser deposition (PLD) of thin films. Deposition parameters were a pulse repetition rate of 10 Hz and a laser fluence of 1–2 $J/cm^2$ and oxygen pressure of 13.6 Pa.

In this connection, the term "by bulk" means polycrystalline bodies that can be of any selected shape, size and thickness.

It was found that the compound $Ca_2InSbO_6$ was the only cubic compound in the series $Ca_2MeSbO_6$ that contradicted Fesenko's observations. $Ca_2AlSbO_6$ was found to be orthorhombic, not cubic, although the distortion from cubicity is small. Similarly, the $Ca_2GaSbO_6$ and $Ca_2ScSbO_6$ compounds were also not cubic, however, in these cases, the distortion from cubicity is large. The $Ca_2YSbO_6$ and $Ca_2LaSbO_6$ compounds, which are not considered within the contemplation of the present invention, were not cubic, which agrees with Fesenko's findings. The $Ca_2GaSbO_6$, $Ca_2ScSbO_6$, $Ca_2YSbO_6$ and $Ca_2LaSbO_6$ compounds were not indexed. Observed dielectric constants of all compounds confirm the Clausius-Mossotti relationship, based on ionic polarizabilities of Shannon et. al using the low polarizability of $Sb^{5+}=1.18\pm0.49$ Å$^3$, which was previously unknown until the work of Tidrow et. al, that dielectric constants are low. The thin films generally exhibit an 00 1 epitaxy on all substrates investigated.

In this connection, the term "thin film" means a body of material that can be of any size with a thickness of between 3.8 A and 100 $\mu$m, which may also be polycrystalline, epitaxial or single crystal and may be grown using any of the numerous known deposition techniques including physical vapor deposition, liquid phase epitaxy, sol gel process, silk screening and so on.

Therefore, all the antimonates investigated by the inventors herein support epitaxial 00 1 growth of YBCO. This is significant because growth of epitaxial quality perovskite oxides like the HTSC requires an epitaxial quality crystal as the template.

The $Ca_2AlSbO_6$ compound would put YBCO films grown on it into compression, which is extremely helpful for reducing cracking of brittle oxide films and affords the advantages of $LaAlO_3$ and LSAT. Thin films of $Ca_2AlSbO_6$ were made on various substrates, such as MgO, $LaAlO_3$, GGG and LSAT, as well as the other compounds listed in Table II, by pulsed laser deposition. Additionally, YBCO was deposited on $Ca_2AlSbO_6$ buffer layers with the YBCO having a predominantly c axis orientation perpendicular to the film, which is a requirement for microwave quality HTSC devices.

The $Ca_2GaSbO_6$ compound would put the a parameter in tension and is almost an exact match for YBCO's b parameter. The remaining antimonate compounds of the system of the present invention also place YBCO films in tension.

Since the most useful antimonates are not cubic, an attempt was made to synthesize a cubic antimonate with a closely matching lattice constant and reduced dielectric constant by preparing a solid solution between $Ca_2AlSbO_6$ and $LaAlO_3$. A 75 mole % $Ca_2AlSbO_6$ and 25 mole %

LaAlO$_3$ solid solution of Lanthanum Calcium Aluminum Antimonate, known as LCAS, was prepared by the techniques described above, with the results given in Table I. Not only was a cubic compound obtained, but the LCAS placed YBCO in compression and provided a dielectric constant smaller than either LaAlO$_3$ or LSAT. Other solid solutions of these materials can tune the lattice parameter, dielectric constant and dielectric loss to fit the desired device applications as needed.

Concerning calculations of the real part of the dielectric constant, the error due to the cavity characterization results in an accuracy of approximately +2% for the real part of the dielectric constant, and limits the resolution of the loss tangent, which is the imaginary component divided by the real component of the dielectric constant to approximately 0.001. The margin of error due to material properties and sample shape can be considerably greater than the cavity characterization error, particularly the error due to low material density.

In the foregoing disclosure, the term "high critical temperature thin film superconductor device" means a copper oxide superconductor having a critical temperature in excess of 30° K. Examples of such superconductors are: REBa$_2$Cu$_3$O$_{7-\delta}$, REBa$_2$Cu$_4$O$_8$ where RE is a rare earth element and $0 \leq \delta \leq 1$, Tl$_2$Ca$_2$Ba$_2$Cu$_3$O$_{10}$, Tl$_1$Ca$_2$Ba$_2$Cu$_3$O$_9$ and Tl$_2$Ba$_2$Ca$_1$Cu$_2$O$_8$ and the series containing Hg compounds: HgBa$_2$Ca$_{n-1}$Cu$_n$O$_{2+2n+x}$ $1 \leq n \leq 6$, HgSr$_2$Ca$_{n-1}$Cu$_n$O$_{2+2n+y}$ $1 \leq n \leq 6$ HgSr$_2$Cu(Me)O$_y$ where Me=Cr, Mo, Re, Y and Hg$_{1-x}$M$_x$Ba$_2$Ca$_{n-1}$Cu$_n$O$_{2n+1}$ where M=Bi, Pb, rare earth $1 \leq m \leq 6$.

The term "single layer device" refers to a device including a single layer of high critical temperature superconducting ferroelectric, pyroeletric, piezoelectric, or ferromagnetic material. The term "multi-layer device" refers to a device including at least two layers of a high critical temperature superconductor, ferroelectric, pyroeletric, piezoelectric, dielectric or ferromagnetic layers.

High critical temperature superconducting, dielectric, ferroelectric, pyroelectric, piezoelectric, and ferromagnetic materials and the compounds of this invention can be used in devices including flux flow transistors, current limiters, broadband impedance transformers, diodes, delay lines, resonators, antenna, antenna feeds, switches, phase shifters, mixers, amplifiers, balometers and magneto-resistors.

The compounds of the invention can be made in the form of a bulk single crystal substrate, a dense polycrystalline disc, a crystalline epitaxial thin film or a polycrystalline thin film. In their manufacture, some form of laser ablation is preferred, but the compounds can also be made by techniques such as sputtering, MOCVD, MBE, evaporation, and so on. The compounds of the present invention can be used in bulk form to serve as targets for the deposition of thin films by such methods as sputtering or laser ablation. The thin films may serve as dielectric buffer layers or dielectric substrates in single and multilayer structures. As single crystals the compounds of this invention can be used as bulk substrates.

The following examples illustrate uses of the Ca$_2$MeSbO$_6$ compounds of this invention.

An antenna can be made according to the invention by depositing a single layer of high critical temperature superconductor (HTSC) directly onto a single crystal LCAS substrate or a substrate of other composition buffered with a layer of LCAS. The HTSC is then patterned to complete the device.

A superconductor insulator superconductor step edge Josephson junction, which is a multilayer superconducting device, is fabricated according to the invention using any of the compounds of the present invention, with LCAS providing the best material for that use. More particularly, the device is made by depositing a single layer of HTSC on a single crystal LCAS substrate or a substrate of other composition buffered with a layer of LCAS. Next, the HTSC is patterned by ion milling at a 45° angle. A layer of LCAS is then deposited. Next, another HTSC layer is deposited and patterned to complete the device.

We wish it to be understood that we do not desire to be limited to the exact details of construction shown and described for obvious modifications will occur to a person skilled in the art.

TABLE 1

BULK PROPERTIES OF Ca$_2$MeSbO$_6$ COMPOUNDS

| COMPOUNDS | LATTICE PARAMETER Å | | Density (g/cm$^3$) | | Dielectric Properties | |
| --- | --- | --- | --- | --- | --- | --- |
| | Measured | Literature | X-ray | Measured | Constant | Loss Tangent ($10^{-3}$) |
| Ca$_2$AlSbO$_6$ | Pseudo-Cubic a = 7.607 Orthorhombic a = 5.321 b = 5.368 c = 7.540 | Cubic a = 3.81 | 4.50 | 4.51 | 9.5 | 6 |
| Ca$_2$GaSbO$_6$ | a = 7.79 | | 4.60 | 4.55 | 11.1 | 3.3 |
| Ca$_2$ScSbO$_6$ | Pseudo-Cubic a = 7.85 | Cubic a = 3.92 | 4.79 | 4.80 | 13.3 | <1 |
| Ca$_2$InSbO$_6$ | a = 7.992 | a = c = 3.968 b = 3.967 β = 91° 31" | 5.38 | 5.16 | 15.0 | 3.0 |
| Ca$_2$YSbO$_6$ | Pseudo-Cubic a = 8.061 | a = c = 4.087 b = 4.028 β = 92° 05" | 5.09 | 4.95 | 14.5 | 4.0 |
| Ca$_2$LaSbO$_6$ | Pseudo-Cubic a = 8.158 | a = c = 4.087 b = 4.085 β = 91° 47" | 5.27 | 5.11 | 16.0 | 5.6 |
| LCAS | Cubic a = 7.561 | | 4.74 | 4.79 | 15.7 | <1 |

TABLE 2

FILM PROPERTIES OF $Ca_2MeSbO_6$ COMPOUNDS

| COMPOUNDS | EPITAXIAL OBSERVED REFLECTIONS |
|---|---|
| $Ca_2AlSbO_6$/(00l)YBCO/(100)LSAT | 002, 004, 006 |
| $Ca_2AlSbO_6$/(100)LSAT | 002, 004, 006 |
| $Ca_2AlSbO_6$/(211)GGG | 420, 422, 600 |
| $Ca_2AlSbO_6$/(100)$LaAlO_3$ | 002, 004, 006 |
| $Ca_2GaSbO_6$/(00l)YBCO/(100)LSAT | 002, 004, 006 |
| $Ca_2GaSbO_6$/(100)LSAT | 002, 004, 006 |
| $Ca_2GaSbO_6$/(211)GGG | 420, 422, 600 |
| $Ca_2GaSbO_6$/(100)$LaAlO_3$ | 002, 004, 006 |
| $Ca_2ScSbO_6$/(00l)YBCO/(100)LSAT | 002, 004, 006 |
| $Ca_2ScSbO_6$/(100)LSAT | 002, 004, 006 |
| $Ca_2ScSbO_6$/(211)GGG | 420, 422, 600 |
| $Ca_2ScSbO_6$/(100)$LaAlO_3$ | 002, 004, 006 |
| $Ca_2InSbO_6$/(00l)YBCO/(100)LSAT | 002, 004, 006 |
| $Ca_2InSbO_6$/(100)LSAT | 002, 004, 006 |
| $Ca_2InSbO_6$/(211)GGG | 420, 422, 600 |
| $Ca_2InSbO_6$/(100)$LaAlO_3$ | 002, 004, 006 |
| $Ca_2YSbO_6$/(00l)YBCO/(100)LSAT | 002, 004, 006 |
| $Ca_2YSbO_6$/(100)LSAT | 002, 004, 006 |
| $Ca_2YSbO_6$/(211)GGG | 420, 422, 600 |
| $Ca_2YSbO_6$/(100)$LaAlO_3$ | 002, 004, 006 |
| $Ca_2LaSbO_6$/(00l)YBCO/(100)LSAT | 002, 004, 006 |
| $Ca_2LaSbO_6$/(100)LSAT | 002, 004, 006 |
| $Ca_2LaSbO_6$/(211)GGG | 420, 422, 600 |
| $Ca_2LaSbO_6$/(100)$LaAlO_3$ | 002, 004, 006 |
| LCAS/(00l)YBCO/(100)LSAT | 002, 004, 006 |
| LCAS/(100)LSAT | 002, 004, 006 |
| LCAS/(211)GGG | 420, 422, 600 |
| LCAS/(100)$LaAlO_3$ | 002, 004, 006 |

What we claim is:

1. A dielectric substrate of the formula $Ca_2AlSbO_6$, comprising:

said dielectric substrate having a dielectric constant of 9.5;

said dielectric substrate being sintered between 1400° and 1550° C. or 20–60 hours;

said dielectric substrate having a loss tangent of $6.0 \times 10^{-3}$ and being lattice matched to a high critical temperature superconductor film;

said general formula including an $Sb^{+5}$ constituent atom having a polarizability of about 1.18 $Å^3$;

said dielectric substrate providing a cubic perovskite structure; and said dielectric substrate having a thin film structure.

2. A dielectric substrate of the formula $Ca_2ScSbO_6$, comprising:

said dielectric substrate having a dielectric constant of 13.3;

said dielectric substrate having a material density of about 4.80 g/cm$^3$;

said dielectric substrate being sintered between 1400° and 1550° C. for 20–60 hours;

said dielectric substrate having a loss tangent of less than $1.0 \times 10^{-3}$ and being lattice matched to a high critical temperature superconductor film;

said general formula including an $Sb^{+5}$ constituent atom having a polarizability of about 1.18 $Å^3$;

said dielectric substrate providing a cubic perovskite structure; and said dielectric substrate having a thin film structure.

3. A dielectric substrate of the formula $Ca_2InSbO_6$, comprising:

said dielectric substrate having a dielectric constant of 15.0;

said dielectric substrate having a material density of about 5.16 g/cm$^3$;

said dielectric substrate being sintered between 1400° and 1550° C. for 20–60 hours;

said dielectric substrate having a loss tangent of $3 \times 10^{-3}$ and being lattice matched to a high critical temperature superconductor film;

said general formula including an $Sb^{+5}$ constituent atom having a polarizability of about 1.18 $Å^3$;

said dielectric substrate providing a cubic perovskite structure; and said dielectric substrate having a thin film structure.

4. A dielectric substrate of the formula $Ca_2GaSbO_6$, comprising:

said dielectric substrate having a dielectric constant of 11.1;

said dielectric substrate having a material density of about 4.55 g/cm$^3$;

said dielectric substrate being sintered between 1400° and 1550° C. for 20–60 hours;

said dielectric substrate having a loss tangent of $3.3 \times 10^{-3}$ and being lattice matched to a high critical temperature superconductor film;

said general formula including an $Sb^{+5}$ constituent atom having a polarizability of about 1.18 $Å^3$;

said dielectric substrate providing a cubic perovskite structure; and said dielectric substrate having a thin film structure.

5. Compounds of the general formula $Ca_2MeSbO_6$ where Me is a 3+ ion selected from the group consisting of aluminum (Al), scandium (Sc), indium (In), gallium (Ga), and a rare earth metal in a thin film structure.

6. A compound of the general formula $Ca_2MeSbO_6$, as recited in claim 5, further comprising:

said compound being composed of $Ca_2AlSbO_6$, said Me being aluminum, said compound having a dielectric constant of 9.5;

said compound having a material density of about 4.51 g/cm$^3$;

said compound being sintered between 1400° and 1550° C. for 20–60 hours;

said compound having a loss tangent of $6.0 \times 10^{-3}$ and being lattice matched to a high critical temperature superconductor film;

said general formula including an $Sb^{+5}$ constituent atom having a polarizability of about 1.18 $Å^3$; and said compound providing a cubic perovskite structure.

7. A compound of the general formula $Ca_2MeSbO_6$, as recited in claim 5, further comprising:

said compound being composed of $Ca_2ScSbO_6$, said Me being scandium;

said compound having a dielectric constant of 13.3;

said compound having a material density of about 4.80 g/cm$^3$;

said compound being sintered between 1400° and 1550° C. for 20×60 hours;

said compound having a loss tangent of less than $1.0 \times 10^{-3}$ and being lattice matched to a high critical temperature superconductor film;

said general formula including an $Sb^{+5}$ constituent atom having a polarizability of about 1.18 $Å^3$; and said compound providing a cubic perovskite structure.

8. A compound of the general formula $Ca_2MeSbO_6$, as recited in claim 5, further comprising:
- said compound being composed of $Ca_2InSbO_6$, said Me being indium;
- said compound having a dielectric constant of 15.0;
- said compound having a material density of about 5.16 g/cm³;
- said compound being sintered between 1400° and 1550° C. for 20–60 hours;
- said compound having a loss tangent of $3\times10^{-3}$ and being lattice matched to a high critical temperature superconductor film;
- said general formula including an $Sb^{+5}$ constituent atom having a polarizability of about 1.18 Å³; and
- said compound providing a cubic perovskite structure.

9. A compound of the general formula $Ca_2MeSbO_6$, as recited in claim 5, further comprising:
- said compound being composed of $Ca_2GaSbO_6$, said Me being gallium;
- said compound having a dielectric constant of 11.1;
- said compound having a material density of about 4.55 g/cm³;
- said compound being sintered between 1400° and 1550° C. for 20–60 hours;
- said compound having a loss tangent of $3.3\times10^{-3}$ and being lattice matched to a high critical temperature superconductor film;
- said general formula including an $Sb^{+5}$ constituent atom having a polarizability of about 1.18 Å³; and
- said compound providing a cubic perovskite structure.

10. A buffer layer of the formula $Ca_2AlSbO_6$, comprising:
- said buffer layer being deposited on a substrate;
- said buffer layer having a dielectric constant of 9.5;
- said buffer layer having a material density of about 4.5 1 g/cm³;
- said buffer layer being sintered between 1400° and 1550° C. for 20×60 hours;
- said buffer layer having a loss tangent of $6.0\times10^{-3}$ and being lattice matched to a high critical temperature superconductor film;
- said general formula including an $Sb^{+5}$ constituent atom having a polarizability of about 1.18 Å³;
- said buffer layer providing a cubic perovskite structure; and
- said buffer layer having a thin film structure.

11. A buffer layer of the formula $Ca_2ScSbO_6$, comprising:
- said buffer layer being deposited on a substrate;
- said buffer layer having a dielectric constant of 13.3;
- said buffer layer having a material density of about 4.80 g/cm³;
- said buffer layer being sintered between 1400° and 1550° C. for 20–60 hours;
- said buffer layer having a loss tangent of less than $1.0\times10^{-3}$ and being lattice matched to a high critical temperature superconductor film;
- said general formula including an $Sb^{+5}$ constituent atom having a polarizability of about 1.18 Å³;
- said buffer layer providing a cubic perovskite structure; and
- said buffer layer having a thin film structure.

12. A buffer layer of the formula $Ca_2InSbO_6$, comprising:
- said buffer layer being deposited on a substrate;
- said buffer layer having a dielectric constant of 15.0;
- said buffer layer having a material density of about 5.16 g/cm³;
- said buffer layer being sintered between 1400° and 1550° C., for 20–60 hours;
- said buffer layer having a loss tangent of $3\times10^{-3}$ and being lattice matched to a high critical temperature superconductor film,
- said general formula including an $Sb^{+5}$ constituent atom having a polarizability of about 1.18 Å³;
- said buffer layer providing a cubic perovskite structure; and
- said buffer layer having a thin film structure.

13. A buffer layer of the formula $Ca_2GaSbO_6$, comprising:
- said buffer layer being deposited on a substrate;
- said buffer layer having a dielectric constant of 11.1;
- said buffer layer having a material density of about 4.55 g/cm³;
- said buffer layer being sintered between 1400° and 1550° C. for 20–60 hours;
- said buffer layer having a loss tangent of $3.3\times10^{-3}$ and being lattice matched to a high critical temperature superconductor film;
- said general formula including an $Sb^{+5}$ constituent atom having a polarizability of about 1.18 Å³;
- said buffer layer providing a cubic perovskite structure; and
- said buffer layer having a thin film structure.

* * * * *

UNITED STATES PATENT AND TRADEMARK OFFICE
CERTIFICATE OF CORRECTION

PATENT NO.     : 6,117,572
DATED          : September 13, 2000
INVENTOR(S)    : Steven C. Tidrow et al.

It is certified that error appears in the above-identified patent and that said Letters Patent is hereby corrected as shown below:

Column 2,
Line 8, correct "Ca 2+" to read -- $Ca^{2+}$ --;

Column 7,
Line 38, correct "or" to read -- for --;

Column 8,
Line 60, correct "20x60" to read -- 20-60 --;

Column 9,
Line 42, correct "20x60" to read -- 20-60 --.

Signed and Sealed this

Twenty-second Day of March, 2005

JON W. DUDAS
*Director of the United States Patent and Trademark Office*